(12) United States Patent
Kim

(10) Patent No.: US 6,215,711 B1
(45) Date of Patent: Apr. 10, 2001

(54) ROW ADDRESS STROBE SIGNAL GENERATING DEVICE

(75) Inventor: Mi Young Kim, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/475,306

(22) Filed: Dec. 30, 1999

(30) Foreign Application Priority Data

Dec. 31, 1998 (KR) .................................................. 98-63796

(51) Int. Cl.[7] ........................................................ G11C 7/00
(52) U.S. Cl. ............................................. 365/193; 365/203
(58) Field of Search .................................... 365/190, 193, 365/203, 222

(56) References Cited

U.S. PATENT DOCUMENTS

| | | | |
|---|---|---|---|
| 5,337,276 | 8/1994 | Matsui | 365/189.11 |
| 5,544,105 | 8/1996 | Hirose et al. | 365/189.11 |
| 5,629,900 | 5/1997 | Hirose et al. | 365/230.03 |
| 5,636,173 * | 6/1997 | Schaefer | 365/230.03 |
| 5,654,931 | 8/1997 | Tamba et al. | 365/230.03 |
| 5,818,770 | 10/1998 | Kim et al. | 365/194 |
| 5,883,841 * | 3/1999 | Wendell | 365/190 |

* cited by examiner

*Primary Examiner*—David Nelms
*Assistant Examiner*—Gene N. Auduong
(74) *Attorney, Agent, or Firm*—Nath & Associates PL; Gary M. Nath

(57) ABSTRACT

The present invention relates to a row address strobe signal generating device for a semiconductor memory device, and in particular a row address strobe signal generating device which can prevent a cell data from being destroyed during a data maintenance time, by sufficiently obtaining a writing time of the cell data. The row address strobe signal generating device includes a write recover signal generating device, and thus controls a disable state of a row address strobe signal during a write operation. Accordingly, the row address strobe signal is disabled only after a write recover signal is disabled. As a result, a cell data writing time is sufficiently obtained in a high speed memory, and thus the stored cell data is not destroyed during the data maintenance time.

5 Claims, 6 Drawing Sheets

ROW ADDRESS STROBE SIGNAL GENERATING DEVICE

BACKGROUND OF THE INVENTION

1. Field of the Invention

The present invention relates to a row address strobe signal generating device for a semiconductor memory device, and in particular to a semiconductor memory device including a row address strobe signal generating device which can prevent a cell data from being destroyed during a data maintenance time, by sufficiently obtaining a writing time of the cell data in a high speed operation.

2. Description of the Background Art

FIG. 1 is a block diagram illustrating a general row address strobe signal generating device. As shown therein, the row address strobe signal generating device includes: an auto-precharge control unit 1 outputting an auto-precharge signal APCG according to an externally-inputted write auto-precharge signal WRWP; a control unit 2 generating a row address strobe precharge signal RAS-PCG according to the auto-precharge signal APCG; and a row address strobe signal generating unit 3 generating a row address strobe signal RAS enabled according to an externally-inputted active signal ACT, and disabled according to the row address strobe precharge signal RAS-PCG.

The operation of the row address strobe signal generating device will now be described with reference to the accompanying operational timing diagrams.

When the active signal ACT is enabled as shown in FIG. 2(b) at a rising edge of an externally-inputted clock signal CLK as shown in FIG. 2(a), the row address strobe signal generating unit 3 is driven, and thus the row address strobe signal RAS is enabled as shown in FIG. 2(e).

Thereafter, a write operation is performed according to row path related signals generated in a chip in relation to the row address strobe signal RAS, thereby storing the data in a memory cell.

In addition, the active signal ACT is enabled as shown in FIG. 2(b). The write auto-precharge signal WRWP is enabled after a predetermined time tRCD as shown in FIG. 2(g), and inputted to the auto-precharge control unit 1.

The data stored in the memory cell is outputted externally from the chip through a data bus line according to a pulse of an externally-inputted column address strobe signal CAS and an inside column address strobe signal ICAS.

Here, as illustrated in FIGS. 2(c) and 2(d), when it is presumed that a burst length is set to be 4, four data are consecutively outputted from an output driver.

Thereafter, as depicted in FIGS. 2(e) and 2(f), when the auto-precharge signal APCG is generated from the auto-precharge control unit 1, and inputted to the control unit 2, the control unit 2 generates the row address strobe precharge signal RAS-PCG. The row address strobe precharge signal RAS-PCG is inputted to the row address strobe signal generating unit 3 through a feedback loop, thus disabling the row address strobe signal RAS.

At this time, the auto-precharge signal APCG outputted from the auto-precharge control unit 1 is generated at a clock when a last write command is inputted or a succeeding clock.

In the case that the row address strobe signal RAS is disabled, a word line is disabled, and thus the write operation is not performed on the memory cell.

Accordingly, as shown in FIG. 2, a time of writing the data in the memory cell is a predetermined time T1.

However, since the semiconductor memory device is operated at a high frequency, the write operation is not finished for a data maintenance time. As a result, the data may be lost for the data writing time.

SUMMARY OF THE INVENTION

It is therefore an object of the present invention to provide a row address strobe signal generating device which can sufficiently obtain a data writing time, by generating a control signal having a predetermined delay in order to obtain a time necessary to write a data in a write operation, and by disabling a row address strobe signal after the control signal is disabled.

In order to achieve the above-described object of the present invention, there is provided a row address strobe signal generating device including: an auto-precharge control unit outputting an auto-precharge signal according to an externally-inputted write auto-precharge signal; a control unit outputting a row address strobe precharge signal in accordance with the auto-precharge signal; a write recover signal generating unit outputting a write recover signal according to a column address strobe signal, an inside column address strobe signal and a read/write control signal; and a row address strobe signal generating unit generating a row address strobe signal enabled according to an externally-inputted active signal, and disabled according to the row address strobe precharge signal and the write recover signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A row address strobe signal generating unit in accordance with a preferred embodiment of the present invention will now be described with reference to the accompanying drawings.

Figure 1:
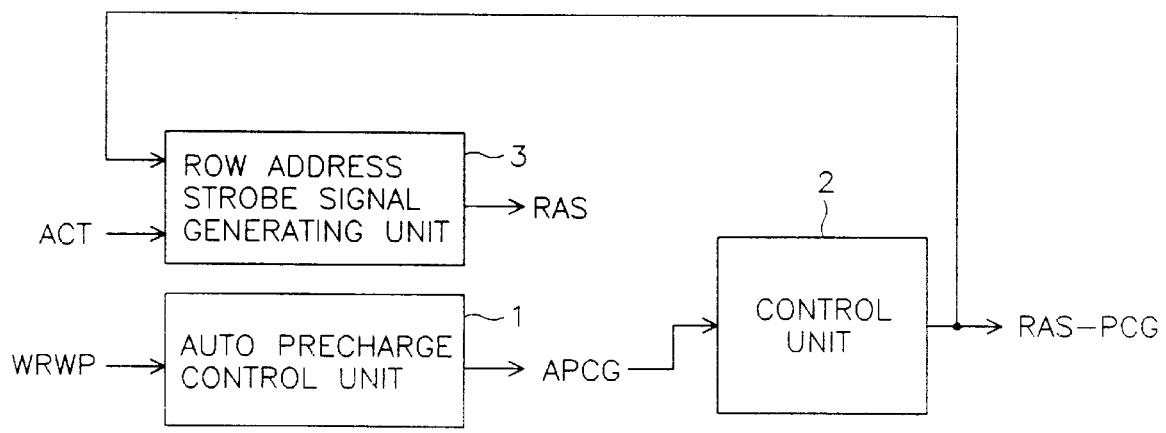
FIG. 1 is a block diagram illustrating a general row address strobe signal generating device.
Figure 2:
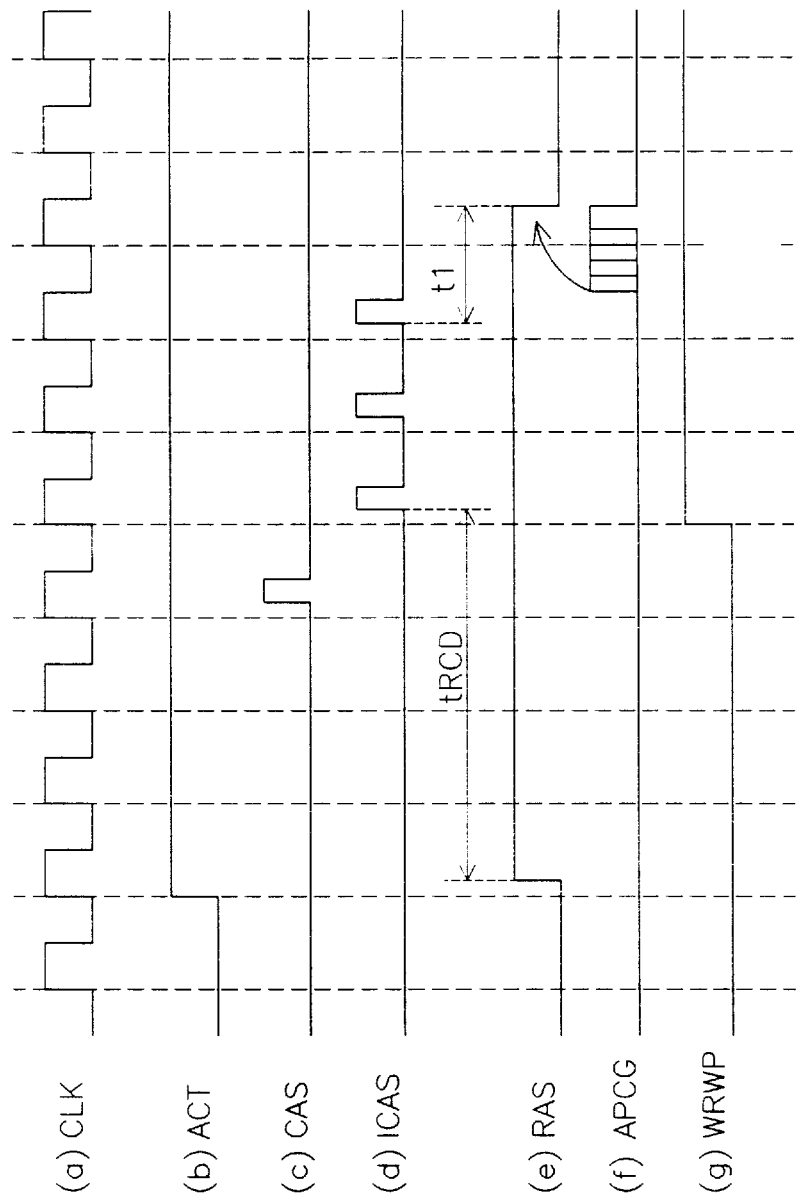
FIG. 2 is an operational timing diagram of FIG. 1.
Figure 3:
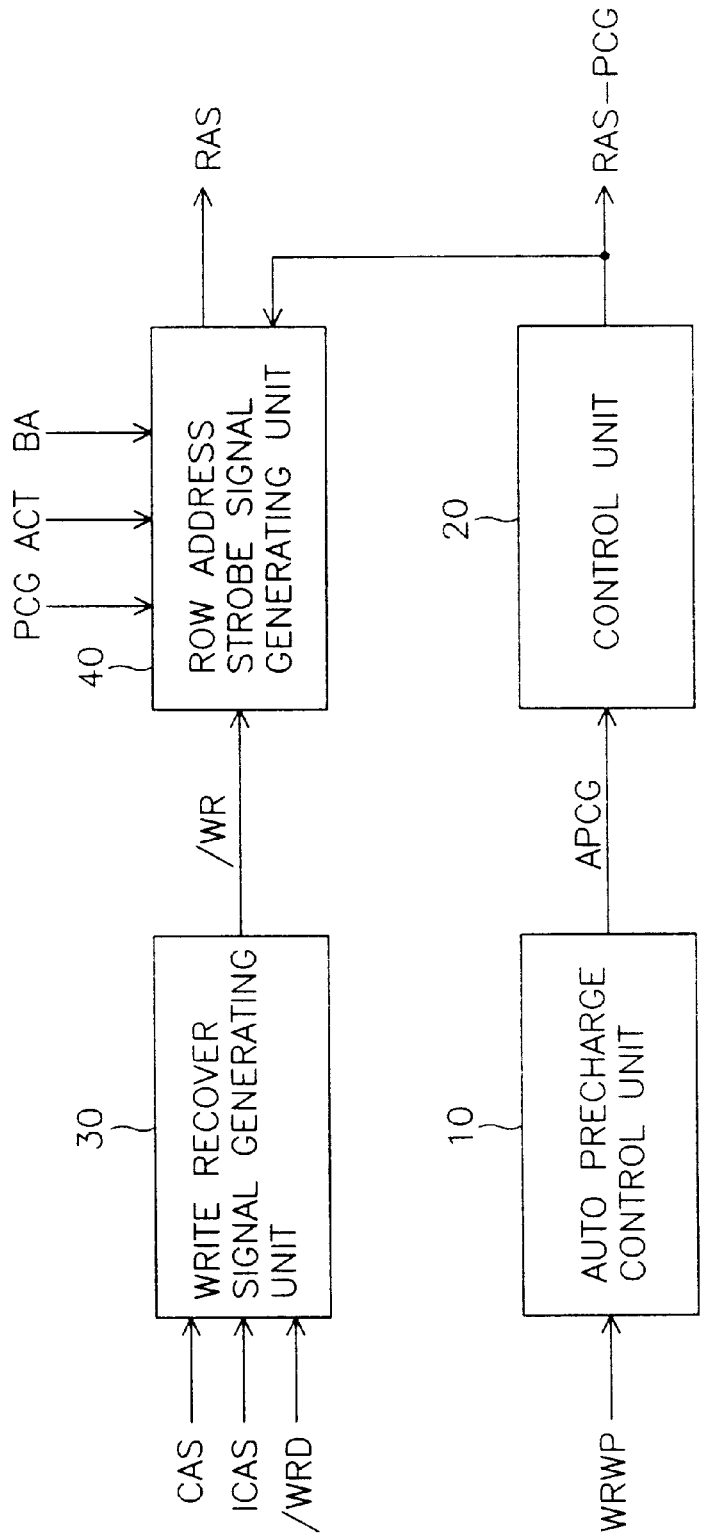
FIG. 3 is a block diagram illustrating a row address strobe signal generating device in accordance with the present invention.

FIG. 3 is a block diagram illustrating the row address strobe signal generating device in accordance with the present invention. As shown therein, the row address strobe signal generating device includes: an auto-precharge control unit 10 outputting an auto-precharge signal APCG according to an externally-inputted write auto-precharge signal WRWP; a control unit 20 outputting a row address strobe precharge signal RAS-PCG in accordance with the auto-precharge signal APCG; a write recover signal generating unit 30 outputting a write recover signal /WR according to a column address strobe signal CAS, an inside column address strobe signal ICAS and a read/write control signal /WRD; and a row address strobe signal generating unit 40 generating a row address strobe signal RAS enabled according to an externally-inputted active signal ACT, and disabled according to the row address strobe precharge signal RAS-PCG and the write recover signal /WR.

Figure 4:
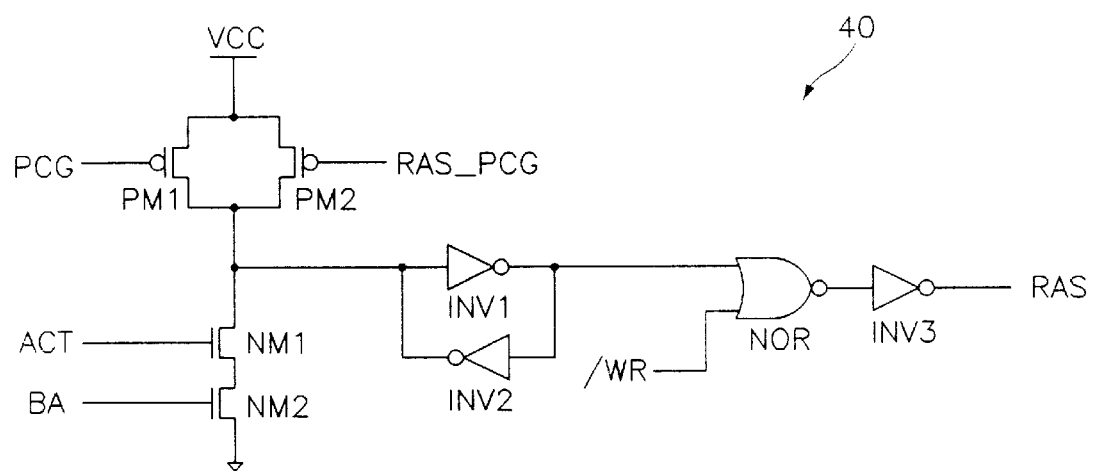
FIG. 4 is a detailed circuit diagram illustrating a row address strobe signal generating unit in FIG. 3.

As illustrated in FIG. 4, the row address strobe signal generating unit 40 includes: a first PMOS transistor PM1 having its source connected to receive a power voltage VCC, and its gate connected to receive a precharge signal PCG; a second PMOS transistor PM2 connected in parallel to the first PMOS transistor PM1, and having its gate connected to receive the row address strobe precharge signal RAS-PCG; first and second NMOS transistors NM1, NM2 connected in series between a commonly-connected drain of the first and second PMOS transistors PM1, PM2 and the ground voltage VSS, and having their gates connected to receive the active signal ACT and a bank signal BA, respectively; first and second inverters INV1, INV2 having their inputs and outputs interactively connected to latch a potential of the commonly-connected drain of the first and second PMOS transistors PM1, PM2; a NOR gate NOR NORing an output from the first inverter INV1 and the write recover signal /WR; and a third inverter INV3 inverting an output from the NOR gate NOR, and outputting the row address strobe signal RAS.

Figure 5:
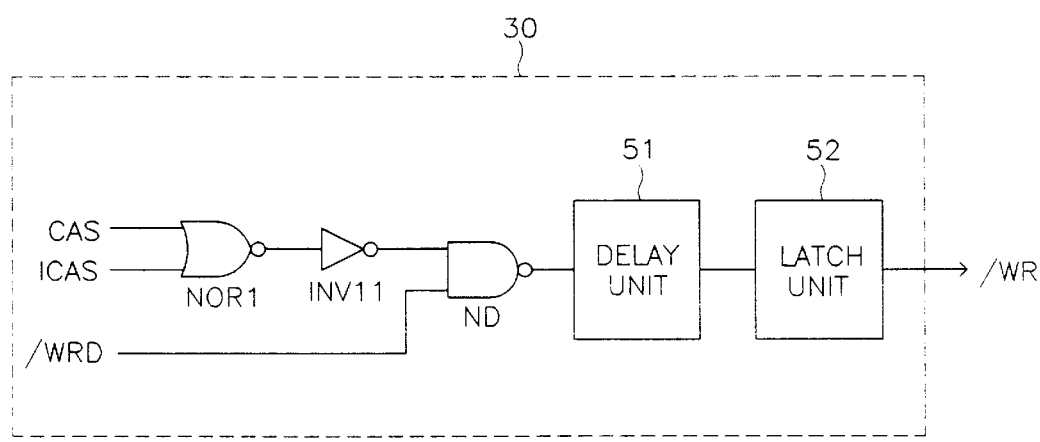
FIG. 5 is a detailed circuit diagram illustrating a write recover signal generating unit in FIG. 3.

As depicted in FIG. 5, the write recover signal generating unit 30 includes: a NOR gate NOR1 NORing the column address strobe signal CAS and the inside column address strobe signal ICAS; an inverter INV11 inverting an output from the NOR gate NOR1; a NAND gate ND NANDing an output from the inverter INV11 and the read/write control signal /WRD; a delay unit 51 delaying an output from the NAND gate ND for a predetermined time; and a latch unit 52 latching an output from the delay unit 51, and outputting the write recover signal /WR.

The read/write signal /WRD is a high level signal during a write operation, and a low level signal during a read operation.

The operation of the write recover signal generating unit 30 will now be described.

When the column address strobe signal CAS or the inside column address strobe signal ICAS becomes a high level, the output from the NOR gate NOR1 becomes a low level, inverted by the inverter INV11, and outputted as a high level signal.

Here, the write recover signal /WR is generated during the write operation, and thus the read/write control signal /WRD maintains at a high level.

Accordingly, the output from the inverter INV11 and the read/write control signal /WRD are NANDed by the NAND gate ND, thereby outputting a low level signal.

The delay unit 51 inversion-delays the output from the NAND gate ND. Here, a delay time of the delay unit 51 is a sufficient time TD to write a data in a memory cell.

The latch unit 52 non-inversion latches an output from the delay unit 51 for a predetermined time, thereby outputting the write recover signal /WR.

The operation of the row address strobe signal generating device in accordance with the preferred embodiment of the present invention will now be explained with reference to the accompanying operational timing diagram.

Figure 6:
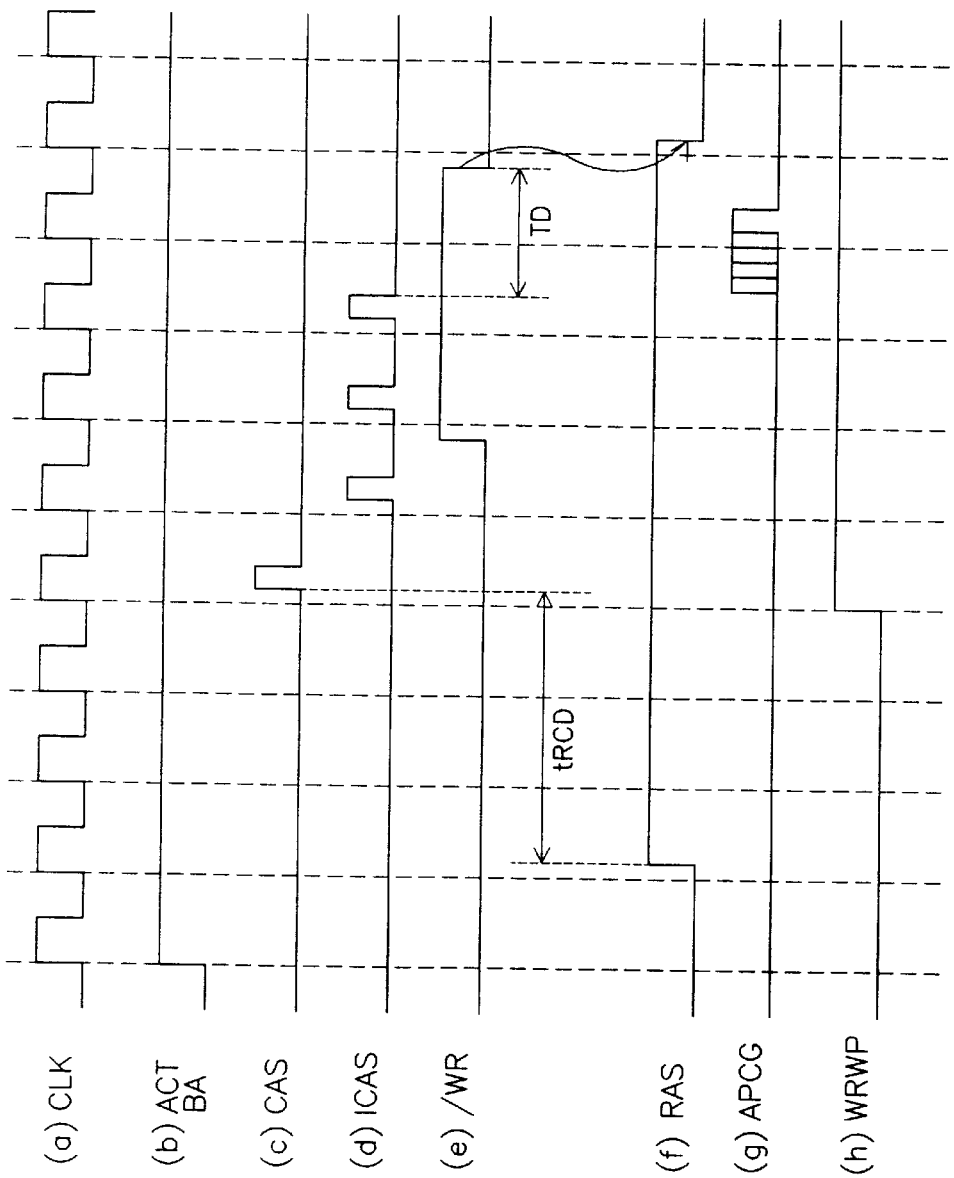
FIG. 6 is an operational timing diagram of FIG. 3.

When the active signal ACT and the bank signal BA are enabled as shown in FIG. 6(*b*) at a rising edge of an externally-inputted clock signal CLK as shown in FIG. 6(*a*), the row address strobe signal generating unit 40 is driven, and thus the row address strobe signal RAS is enabled as shown in FIG. 6(*f*).

Thereafter, the write operation is performed according to row path related signals generated in a chip in relation to the row address strobe signal RAS, thereby storing the data in the memory cell.

In addition, the active signal ACT and the bank signal BA are enabled as shown in FIG. 6(*b*). The write auto-precharge command WRWP is enabled after a predetermined time tRCD as shown in FIG. 6(*h*), and inputted to the auto-precharge control unit 10.

As illustrated in FIGS. 6(*c*) and 6(*d*), the data stored in the memory cell is outputted externally from the chip through a data bus line according to a pulse of the externally-inputted column address strobe signal CAS and the inside column address strobe signal ICAS.

Here, when it is presumed that a burst length is set to be 4, four data are consecutively outputted from an output driver.

Thereafter, as depicted in FIGS. 6(*f*) and 6(*g*), when the auto-precharge signal APCG is generated from the autoprecharge control unit 10, and inputted to the control unit 20, the control unit 20 generates the row address strobe precharge signal RAS-PCG. The row address strobe precharge signal RAS-PCG is inputted to the row address strobe signal generating unit 30 through a feedback loop.

At this time, the auto-precharge signal APCG outputted from the auto-precharge control unit 10 is generated at a clock when a last write command is inputted or a succeeding clock.

As shown in FIG. 6(*e*), when the write recover signal /WR from the write recover signal generating unit 30 is disabled, the row address strobe signal RAS is also disabled.

In the case that the row address strobe signal RAS is disabled, a word line is disabled, and thus the write operation is not performed on the memory cell.

As discussed earlier, in accordance with the present invention, the data writing time can be sufficiently obtained even when the semiconductor memory device is operated at a high frequency, thereby precisely writing the data.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A row address strobe signal generating device comprising:

an auto-precharge control unit for outputting an auto-precharge signal according to an externally-inputted write auto-precharge signal;

a control unit for outputting a row address strobe precharge signal in accordance with the auto-precharge signal;

a write recover signal generating unit for outputting a write recover signal according to a column address strobe signal, an inside column address strobe signal and a read/write control signal; and a row address strobe signal generating unit for generating a row address strobe signal enabled according to an externally-inputted active signal, and disabled according to the row address strobe precharge signal and the write recover signal.

2. The device according to claim 1, wherein the row address strobe signal generating unit comprises:

a first PMOS transistor having its source connected to receive a power voltage, and its gate connected to receive a precharge signal;

a second PMOS transistor connected in parallel to the first PMOS transistor, and having its gate connected to receive the row address strobe precharge signal;

first and second NMOS transistors connected in series between a commonly-connected drain of the first and second PMOS transistors and the ground voltage, and having their gates connected to receive the active signal and a bank signal, respectively;

first and second inverters having their inputs and outputs interactively connected to latch a potential of the commonly-connected drain of the first and second PMOS transistors;

a NOR gate for NORing an output from the first inverter and the write recover signal; and a third inverter for inverting an output from the NOR gate, and outputting the row address strobe signal.

3. The device according to claim 1, wherein the write recover signal generating unit comprises:

a NOR gate for NORing the column address strobe signal and the inside column address strobe signal;

an inverter for inverting an output from the NOR gate;

a NAND gate for NANDing an output from the inverter and the read/write control signal;

a delay unit for delaying an output from the NAND gate for a predetermined time; and a latch unit for latching an output from the delay unit, and outputting the write recover signal.

4. The device according to claim 3, wherein the read/write signal is a high level signal during a write operation, and a low level signal during a read operation.

5. The device according to claim 3, wherein a delay time of the delay unit is a time necessary to write a data.

* * * * *